United States Patent
Chen et al.

(10) Patent No.: US 11,452,375 B2
(45) Date of Patent: Sep. 27, 2022

(54) SLIDE RAIL ASSEMBLY

(71) Applicants: King Slide Works Co., Ltd., Kaohsiung (TW); King Slide Technology Co., Ltd., Kaohsiung (TW)

(72) Inventors: Ken-Ching Chen, Kaohsiung (TW); Shun-Ho Yang, Kaohsiung (TW); Wei-Chen Chang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 17/182,421

(22) Filed: Feb. 23, 2021

(65) Prior Publication Data
US 2022/0133035 A1     May 5, 2022

(30) Foreign Application Priority Data
Oct. 29, 2020 (TW) .................................. 109138013

(51) Int. Cl.
*A47B 88/49* (2017.01)
*A47B 96/07* (2006.01)
*A47B 88/423* (2017.01)
*H05K 7/18* (2006.01)

(52) U.S. Cl.
CPC .............. *A47B 88/49* (2017.01); *A47B 96/07* (2013.01); *A47B 88/423* (2017.01); *H05K 7/183* (2013.01)

(58) Field of Classification Search
CPC ............................. A47B 88/49; A47B 88/423
See application file for complete search history.

(56) References Cited

U.S. PATENT DOCUMENTS

| | | | | |
|---|---|---|---|---|
| 6,578,939 | B1 * | 6/2003 | Mayer | A47B 88/49 403/194 |
| 8,282,176 | B1 * | 10/2012 | Chen | A47B 88/493 312/334.46 |
| 9,131,624 | B1 | 9/2015 | Johnson et al. | |
| 10,244,868 | B2 * | 4/2019 | Chen | F16C 29/04 |
| 10,349,741 | B2 | 7/2019 | Chen et al. | |
| 10,568,426 | B1 * | 2/2020 | Chen | H05K 7/1489 |
| 10,588,409 | B2 | 3/2020 | Chen et al. | |
| 10,806,256 | B1 * | 10/2020 | Chen | A47B 88/43 |
| 10,918,209 | B1 * | 2/2021 | Chen | A47B 88/57 |

(Continued)

FOREIGN PATENT DOCUMENTS

| | | | |
|---|---|---|---|
| EP | 2893838 B1 | 5/2016 | |
| JP | 2018114263 A | 7/2018 | |
| JP | 2019051292 A | 4/2019 | |

*Primary Examiner* — Hanh V Tran
(74) *Attorney, Agent, or Firm* — Karin L. Williams; Alan D. Kamrath; Mayer & Williams PC (57) ABSTRACT

A slide rail assembly includes a first rail, a second rail, a first bracket, a second bracket and a supporting feature. The first rail is configured to be mounted to a rack through the first bracket and the second bracket. The second rail is movable relative to the first rail and is configured to carry a carried object. The supporting feature is arranged on the first bracket. When the second rail is located at a predetermined position relative to the first rail, an end of the second rail is not extended beyond the supporting feature, and the supporting feature is configured to support a predetermined portion of the carried object.

15 Claims, 7 Drawing Sheets

(56) References Cited

U.S. PATENT DOCUMENTS

| | | | | |
|---|---|---|---|---|
| 11,009,069 B1* | 5/2021 | Chen | .................... | H05K 7/1489 |
| 2004/0227441 A1* | 11/2004 | Wang | .................... | A47B 88/49 |
| | | | | 312/334.8 |
| 2010/0033926 A1* | 2/2010 | Du | ........................ | A47B 88/49 |
| | | | | 361/679.58 |
| 2011/0100936 A1* | 5/2011 | Chang | .................. | H05K 7/1489 |
| | | | | 211/26 |
| 2012/0187816 A1* | 7/2012 | Chen | .................... | E05B 65/463 |
| | | | | 312/334.8 |
| 2015/0189989 A1* | 7/2015 | Chen | .................... | H05K 7/1489 |
| | | | | 248/219.3 |
| 2015/0201754 A1* | 7/2015 | Chen | .................... | A47B 96/07 |
| | | | | 248/219.3 |
| 2016/0278522 A1* | 9/2016 | Chen | .................... | A47B 88/407 |
| 2018/0092462 A1* | 4/2018 | Chen | .................... | A47B 88/493 |
| 2018/0140093 A1* | 5/2018 | Chen | .................... | A47B 88/493 |
| 2018/0168341 A1* | 6/2018 | Chen | .................... | A47B 88/43 |
| 2018/0220797 A1* | 8/2018 | Chen | .................... | H05K 7/1489 |
| 2018/0360212 A1* | 12/2018 | Chen | .................... | H05K 7/1489 |
| 2019/0059585 A1* | 2/2019 | Chen | .................... | A47B 88/43 |
| 2019/0082835 A1* | 3/2019 | Chen | .................... | H05K 7/1411 |
| 2019/0274428 A1* | 9/2019 | Chen | .................... | H05K 7/1489 |
| 2019/0298060 A1* | 10/2019 | Chen | .................... | A47B 88/483 |
| 2019/0323629 A1* | 10/2019 | Chen | .................... | H05K 7/183 |
| 2019/0335903 A1* | 11/2019 | Chen | .................... | A47B 88/427 |
| 2020/0022493 A1* | 1/2020 | Chen | .................... | A47B 88/49 |
| 2020/0107636 A1* | 4/2020 | Chen | .................... | H05K 7/1489 |
| 2020/0187644 A1* | 6/2020 | Chen | .................... | A47B 88/407 |
| 2020/0221868 A1* | 7/2020 | Hsu | ........................ | H05K 7/183 |
| 2021/0169223 A1* | 6/2021 | Chen | .................... | F16C 29/005 |

\* cited by examiner

SLIDE RAIL ASSEMBLY

BACKGROUND OF THE INVENTION

1. Field of the Invention

The present invention relates to a slide rail assembly applicable to a rack, and more particularly, to a slide rail assembly having a supporting mechanism.

2. Description of the Prior Art

Generally, in a rack system, a carried object (such as an electronic device) is usually mounted to a rack through a pair of slide rail assemblies. Each of the slide rail assemblies usually comprises a fixed rail fixed to the rack, and a movable rail movable relative to the fixed rail, in order to allow the carried object to be moved out of the rack or to be pushed into the rack.

Sometimes the slide rail assembly can be only partially mounted to a specific part of the carried object due to a special structural arrangement of the carried object. For example, U.S. Pat. No. 9,131,624 B1 discloses a carried object (a chassis) having a front part and a rear part. A width of the rear part is narrower than a width of the front part. Due to such structural arrangement of the carried object, a pair of slide rail assemblies (or movable rails of a pair of slide rail assemblies) can be only mounted to two sides of the rear part of the carried object. The total width of the rear part of the carried object and the pair of slide rail assemblies is substantially equal to the width of the front part of the carried object.

However, in the situation of the slide rail assembly being only mounted to the rear part of the carried object, supporting strength of the slide rail assembly for other parts (such as the front part) of the carried object may not be sufficient. Therefore, it is important to develop a different slide rail assembly.

SUMMARY OF THE INVENTION

The present invention provides a slide rail assembly having a supporting mechanism.

According to an embodiment of the present invention, a slide rail assembly comprises a first rail, a second rail, an extension member, a first bracket and a supporting feature. The first rail has a first end. The first rail has a first side and a second side opposite to the first side. The first rail comprises a first wall, a second wall and a longitudinal wall connected between the first wall and the second wall of the first rail. The first wall and the second wall of the first rail are located at the first side. The second rail is longitudinally movable relative to the first rail at the first side of the first rail. The second rail has a first end. The extension member is arranged at the second side of the first rail, and the extension member is extended beyond the first end of the first rail. The first bracket is arranged on the extension member. The first bracket comprises a side wall and at least one first mounting member located adjacent to the side wall. The supporting feature is arranged on the first bracket. When the second rail is located at a retracted position relative to the first rail, the first end of the second rail is not extended beyond the supporting feature.

Preferably, the slide rail assembly further comprises a third rail. A passage is defined by the first wall, the second wall and the longitudinal wall of the first rail. The passage is configured to accommodate the third rail, such that the third rail is located at the first side of the first rail.

Preferably, the third rail is movably mounted between the first rail and the second rail. The second rail is longitudinally movable relative to the first rail at the first side of the first rail through the third rail.

Preferably, the supporting feature is transversely extended relative to the side wall of the first bracket.

Preferably, the first bracket is mounted to an extension passage of the extension member through a frame.

Preferably, the slide rail assembly further comprises a second bracket. At least one of the first bracket and the second bracket is longitudinally movable relative to the first rail.

Preferably, the second bracket comprises a side part and at least one second mounting member located adjacent to the side part. The side part is arranged with a supporting member. The supporting member has at least one first supporting section and at least one second supporting section connected to the at least one first supporting section. The at least one first supporting section is configured to support one of the first wall and the second wall of the first rail, and the at least one second supporting section is configured to support one of a first predetermined part and a second predetermined part of the extension member.

Preferably, the at least one first supporting section and the at least one second supporting section of the supporting member are located on different longitudinal planes, and a longitudinal length of the at least one second supporting section is greater than a longitudinal length of the at least one first supporting section.

Preferably, the supporting member has two first supporting sections, two second supporting sections and a middle section connected between the two second supporting sections. The supporting member is configured to partially cover the first rail through the two first supporting sections and the middle section. The supporting member is configured to partially cover the extension member through the two second supporting sections and the middle section.

According to another embodiment of the present invention, a slide rail assembly comprises a first rail, a second rail, a third rail, a first bracket, a second bracket and a supporting feature. The first rail has a first side and a second side opposite to the first side. The second rail is longitudinally movable relative to the first rail at the first side of the first rail through the third rail. The first bracket and the second bracket are located at the second side of the first rail. At least one of the first bracket and the second bracket is longitudinally movable relative to the first rail. The supporting feature is arranged on the first bracket. When the second rail is located at a predetermined position relative to the first rail, an end of the second rail is not extended beyond the supporting feature.

Preferably, the slide rail assembly further comprises an extension member arranged at the second side of the first rail. The extension member is extended beyond a first end of the first rail. The first rail comprises a first wall, a second wall and a longitudinal wall connected between the first wall and the second wall of the first rail.

Preferably, the first bracket is arranged on the extension member. The first bracket comprises a side wall and at least one mounting member located adjacent to the side wall.

Preferably, a passage is defined by the first wall, the second wall and the longitudinal wall of the first rail. The passage is configured to accommodate the third rail, such that the third rail is located at the first side of the first rail.

Preferably, the third rail is movably mounted between the first rail and the second rail.

Preferably, the supporting feature is transversely extended relative to the side wall of the first bracket.

Preferably, the first bracket is mounted to an extension passage of the extension member through a frame.

Preferably, the second bracket comprises a side part and at least one second mounting member located adjacent to the side part. The side part is arranged with a supporting member. The supporting member has two first supporting sections, two second supporting sections and a middle section. The supporting member is configured to partially cover the first rail through the two first supporting sections and the middle section. The supporting member is configured to partially cover the extension member through the two second supporting sections and the middle section.

According to another embodiment of the present invention, a slide rail assembly is configured to mount a carried object to a rack. The carried object comprises a front part and a rear part. The front part has a first width, and the rear part has a second width smaller than the first width. The slide rail assembly comprises a first rail, a first bracket, a second bracket, a second rail and a supporting feature. The first bracket and the second bracket are configured to mount the first rail to a first post and a second post of the rack. The second rail is longitudinally movable relative to the first rail. The second rail is mounted to the rear part of the carried object. The supporting feature is arranged on the first bracket. When the second rail is located at a retracted position relative to the first rail, the supporting feature is configured to support the front part of the carried object.

Preferably, when the second rail is moved relative to the first rail from the retracted position to an extension position along one direction, the supporting feature is configured to support one of the front part and the rear part of the carried object.

Preferably, the slide rail assembly further comprises an extension member arranged on the first rail. The extension member is extended beyond a first end of the first rail. The first bracket is arranged on the extension member. The first bracket comprises at least one first mounting member configured to be mounted to at least one first hole of the first post. The second bracket comprises a side part and at least one second mounting member located adjacent to the side part. The side part is arranged with a supporting member. The supporting member has at least one first supporting section and at least one second supporting section. The at least one first supporting section is configured to support the first rail. The at least one second supporting section is configured to support the extension member. The at least one second mounting member is configured to be mounted to at least one second hole of the second post.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
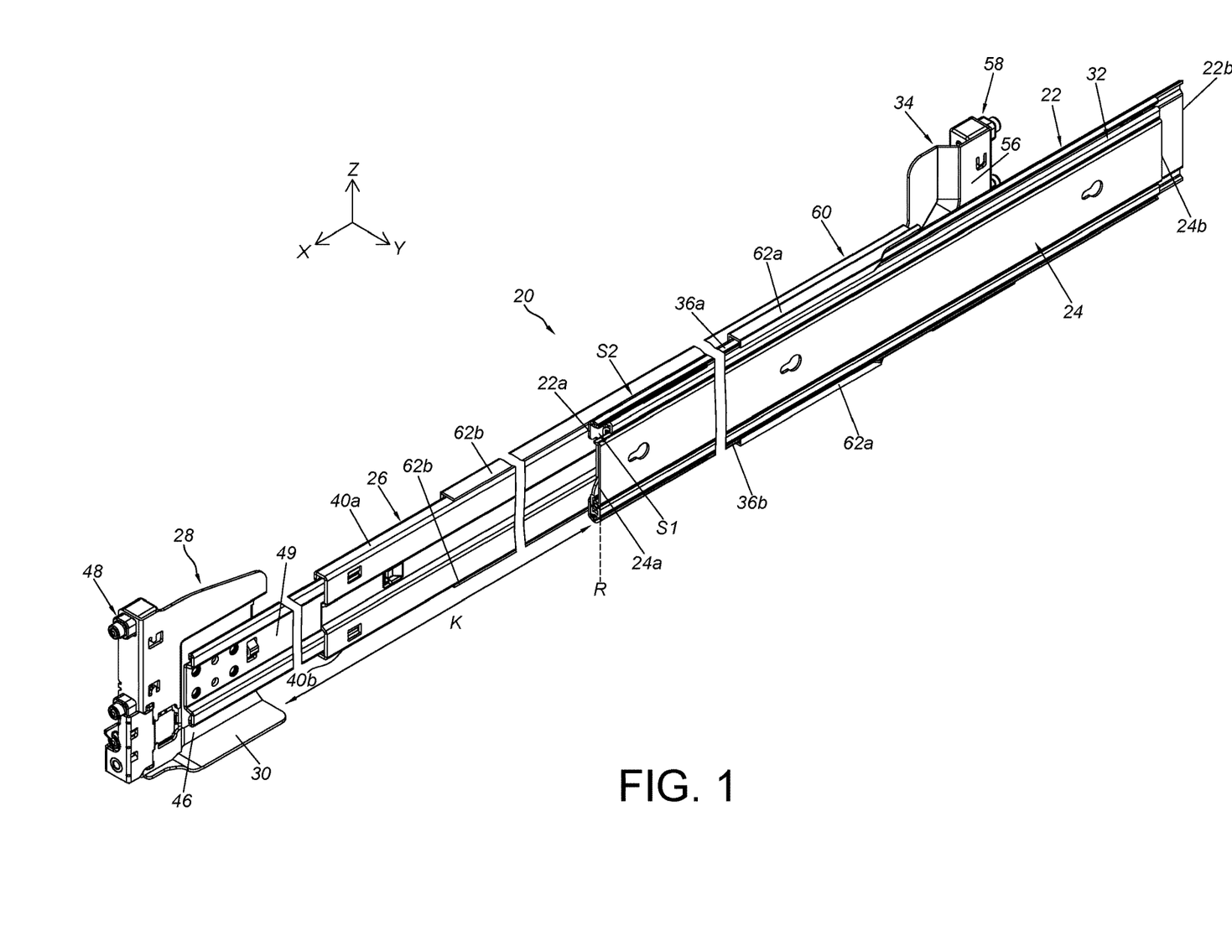
FIG. 1 is a diagram showing a slide rail assembly according to an embodiment of the present invention.
Figure 2:
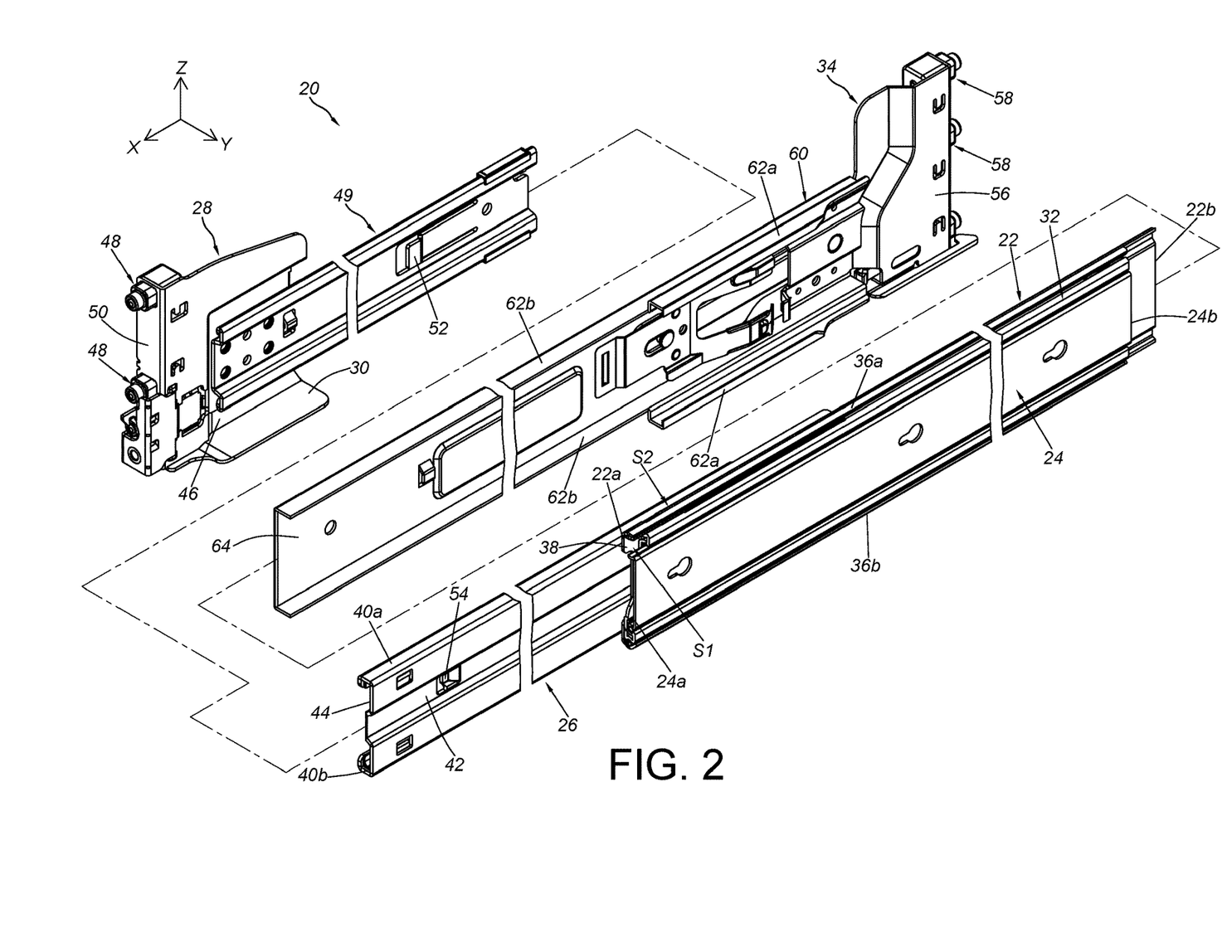
FIG. 2 is an exploded view of the slide rail assembly according to an embodiment of the present invention.

As shown in FIG. 1 and FIG. 2, a slide rail assembly 20 comprises a first rail 22, a second rail 24, an extension member 26, a first bracket 28 and a supporting feature 30 according to an embodiment of the present invention. Preferably, the slide rail assembly 20 further comprises a third rail 32 and a second bracket 34. The third rail 32 is movably mounted between the first rail 22 and the second rail 24 to form a so-called three-section slide rail assembly 20. The first rail 22 (such as an outer rail), the second rail 24 (such as an inner rail) and the third rail 32 (such as a middle rail) are longitudinally movable relative to each other. Moreover, in the present embodiment, an X-axis direction is a longitudinal direction (or a length direction or a moving direction of the slide rails), a Y-axis direction is a transverse direction (or a lateral direction of the slide rails), and a Z-axis direction is a vertical direction (or a height direction of the slide rails).

The first rail 22 has a first end 22*a* (such as a front end) and a second end 22*b* (such as a rear end) away from the first end 22*a*, but the present invention is not limited thereto. The first rail 22 has a first side S1 and a second side S2 opposite to the first side S1. The first rail 22 comprises a first wall 36*a*, a second wall 36*b* and a longitudinal wall 38 connected between the first wall 36*a* and the second wall 36*b* of the first rail 22. The first wall 36*a* and the second wall 36*b* of the first rail 22 are located at the first side S1. Preferably, a passage is defined by the first wall 36*a*, the second wall 36*b* and the longitudinal wall 38 of the first rail 22. The passage is configured to accommodate the third rail 32, such that the third rail 32 is located at the first side S1 of the first rail 22.

The second rail 24 is longitudinally movable relative to the first rail 22 at the first side S1 of the first rail 22 through the third rail 32. The second rail 24 has a first end 24*a* (such as a front end) and a second end 24*b* (such as a rear end) away from the first end 24*a*, but the present invention is not limited thereto. Moreover, the second rail 24 is movably mounted to a passage of the third rail 32, and the second rail 24 is longitudinally movable relative to the third rail 32.

The extension member 26 is arranged at the second side S2 of the first rail 22, and at least one portion of the extension member 26 is extended beyond the first end 22a of the first rail 22. The extension member 26 is connected (such as fixedly connected, but not limited thereto) to the first rail 22. Therefore, the extension member 26 and the first rail 22 can be regarded as one piece. The extension member 26 is configured to extend a length of the first rail 22 or increase partial thickness of the first rail 22, so as to improve structural strength of the first rail 22. Preferably, the extension member 26 comprises a first predetermined part 40a, a second predetermined part 40b and a middle part 42 connected between the first predetermined part 40a and the second predetermined part 40b, and an extension passage 44 is defined by the first predetermined part 40a, the second predetermined part 40b and the middle part 42.

The first bracket 28 is arranged on the extension member 26, such that the first bracket 28 is located at the second side S2 of the first rail 22. The first bracket 28 comprises a side wall 46 and at least one first mounting member 48 located adjacent to the side wall 46. Preferably, the first bracket 28 further comprises an end wall 50 substantially perpendicularly connected to the side wall 46, the end wall 50 is located in front of the side wall 46, and the at least one first mounting member 48 is arranged on the end wall 50. Preferably, the first bracket 28 is movably mounted to the extension passage 44 of the extension member 26 through a frame 49. Preferably, the frame 49 and the extension passage 44 of the extension member 26 are respectively provided with a first limiting structure 52 and a second limiting structure 54 configured to interact with each other, such that when the first bracket 28 is moved to one position (such as a maximum opening position) relative to the extension member 26, the first limiting structure 52 and the second limiting structure 54 are configured to contact each other to provide a blocking effect.

The supporting feature 30 is arranged on the first bracket 28. Preferably, the supporting feature 30 has a plate body transversely extended relative to the side wall 46 of the first bracket 28, and the supporting feature 30 is located at a lateral side of the side wall 46. Preferably, the supporting feature 30 is integrated with the side wall 46 of the first bracket 28. Or, in other alternative embodiments, the supporting feature 30 is an additional component connected to the side wall 46 of the first bracket 28, but the present invention is not limited thereto.

The second bracket 34 is located at the second side S2 of the first rail 22. The second bracket 34 comprises a side part 56 and at least one second mounting member 58 located adjacent to the side part 56. The side part 56 is arranged with a supporting member 60, and the supporting member 60 has at least one first supporting section 62a and at least one second supporting section 62b connected to the at least one first supporting section 62a. The at least one first supporting section 62a and the at least one second supporting section 62b are located on different longitudinal planes, and a longitudinal length of the at least one second supporting section 62b is greater than a longitudinal length of the at least one first supporting section 62a. According to such arrangement, a contour of the supporting member 60 matches the first rail 22 and the extension member 26. Moreover, the at least one first supporting section 62a is configured to support one of the first wall 36a and the second wall 36b of the first rail 22. In the present embodiment, the supporting member 60 has two first supporting sections 62a configured to support the first wall 36a and the second wall 36b of the first rail 22. On the other hand, the at least one second supporting section 62b is configured to support one of the first predetermined part 40a and the second predetermined part 40b of the extension member 26. In the present embodiment, the supporting member 60 has two second supporting sections 62b configured to support the first predetermined part 40a and the second predetermined part 40b of the extension member 26.

Preferably, the supporting member 60 further has a middle section 64 connected between the two second supporting sections 62b. The supporting member 60 is configured to partially cover the first rail 22 through the two first supporting sections 62a and the middle section 64, so as to improve structural strength of the first rail 22. The supporting member 60 is configured to partially cover the extension member 26 through the two second supporting sections 62b and the middle section 64, so as to improve structural strength of the extension member 26.

When the second rail 24 is located at a predetermined position, such as a retracted position R, relative to the first rail 22, the first end 24a of the second rail 24 is not extended beyond the supporting feature 30 (as shown in FIG. 1). Moreover, when the second rail 24 is located at the predetermined position, the first end 24a of the second rail 24 is a predetermined distance K away from the supporting feature 30.

Figure 3:
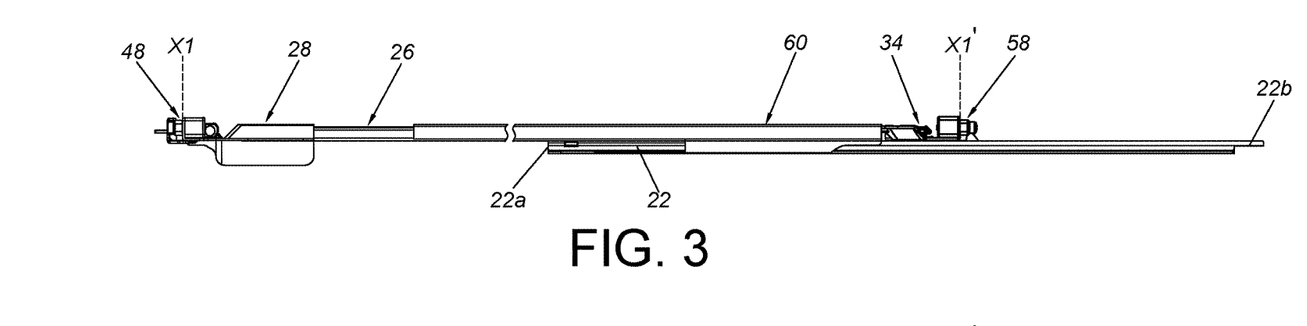
FIG. 3 is a diagram showing two brackets of the slide rail assembly being respectively located at a first front adjustment position and a first rear adjustment position relative to a first rail according to an embodiment of the present invention.
Figure 4:
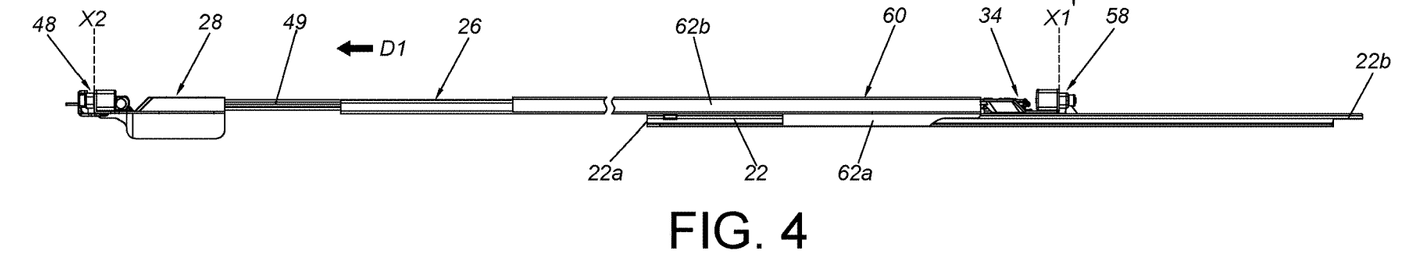
FIG. 4 is a diagram showing one of the two brackets of the slide rail assembly being moved relative to the first rail along a first direction to a second front adjustment position according to an embodiment of the present invention.
Figure 5:
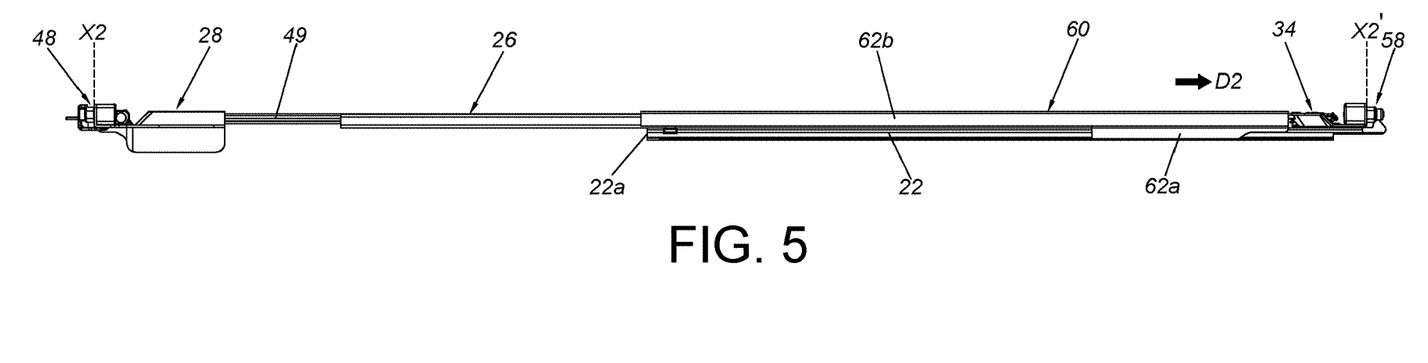
FIG. 5 is a diagram showing the other one of the two brackets of the slide rail assembly being moved relative to the first rail along a second direction to a second rear adjustment position according to an embodiment of the present invention.

As shown FIG. 3 to FIG. 5, at least one of the first bracket 28 and the second bracket 34 is longitudinally movable relative to the first rail 22. In the present embodiment, both the second bracket 34 and the first bracket 28 are longitudinally movable relative to the first rail 22.

Furthermore, the first bracket 28 is configured to be located at a first front adjustment position X1 relative to the first rail 22, and the second bracket 34 is configured to be located at a first rear adjustment position X1' relative to the first rail 22. The first bracket 28 can be moved relative to the extension member 26 along a first direction D1 through the frame 49, such that the first bracket 28 is movable relative to the first rail 22 from the first front adjustment position X1 (as shown in FIG. 3) to a second front adjustment position X2 (as shown in FIG. 4) along the first direction D1. On the other hand, the second bracket 34 can be moved relative to the first rail 22 along a second direction D2 through the supporting member 60, such that the second bracket 34 is movable relative to the first rail 22 from the first rear adjustment position X1' (as shown in FIG. 4) to a second rear adjustment position X2' (as shown in FIG. 5) along the second direction D2. The second direction D2 is opposite to the first direction D1.

Therefore, when the first bracket 28 and the second bracket 34 are respectively located at the first front adjustment position X1 and the first rear adjustment position X1' (as shown in FIG. 3) relative to the first rail 22, a first adjustment distance is defined between the at least one first mounting member 48 of the first bracket 28 and the at least one second mounting member 58 of the second bracket 34; when the first bracket 28 and the second bracket 34 are respectively located at the second front adjustment position X2 and the second rear adjustment position X2' (as shown in FIG. 5) relative to the first rail 22, a second adjustment distance is defined between the at least one first mounting member 48 of the first bracket 28 and the at least one second mounting member 58 of the second bracket 34. The second adjustment distance is greater than the first adjustment distance.

Figure 6:
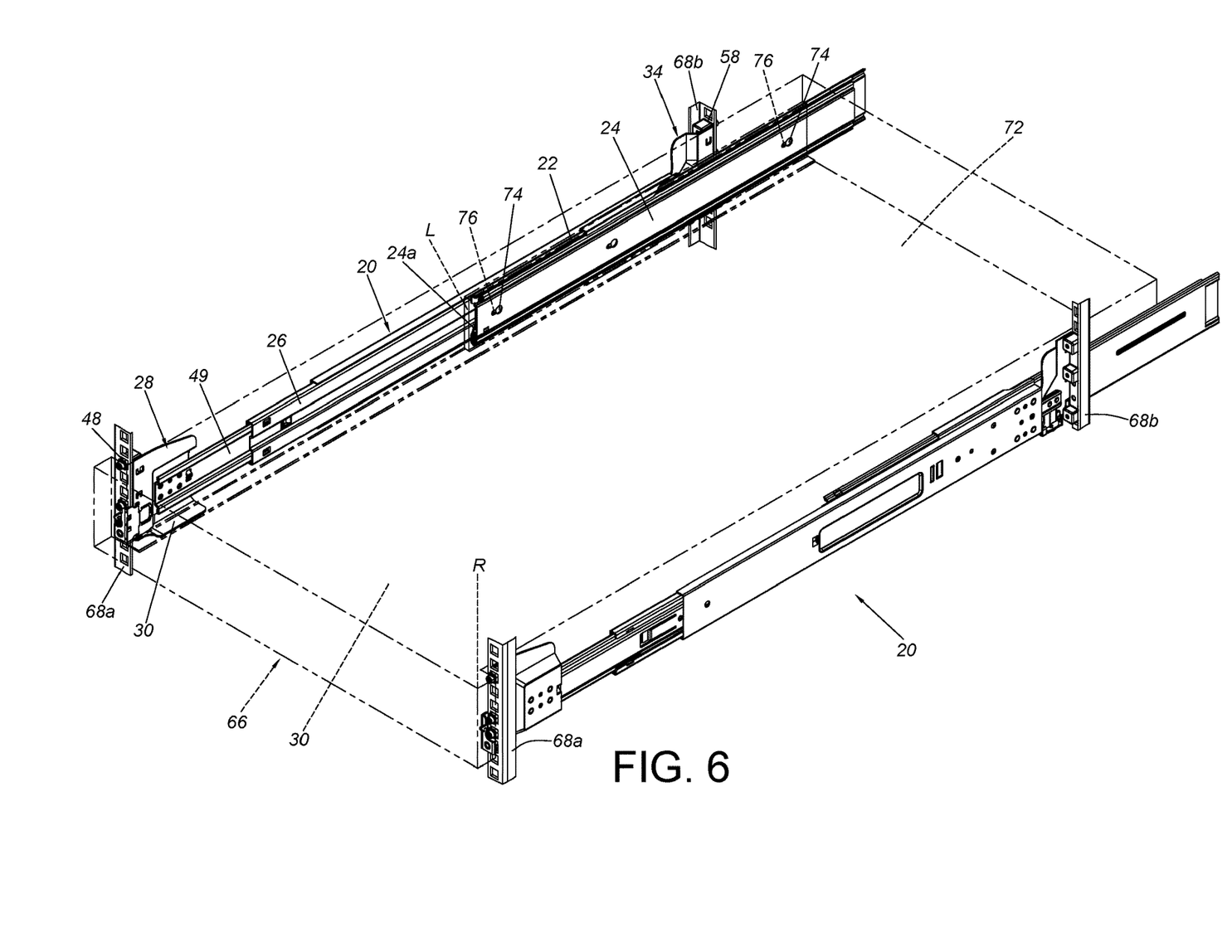
FIG. 6 is a diagram showing a carried object configured to be mounted to a rack through the slide rail assembly, and the carried object being located at a retracted position through a second rail according to an embodiment of the present invention.
Figure 7:
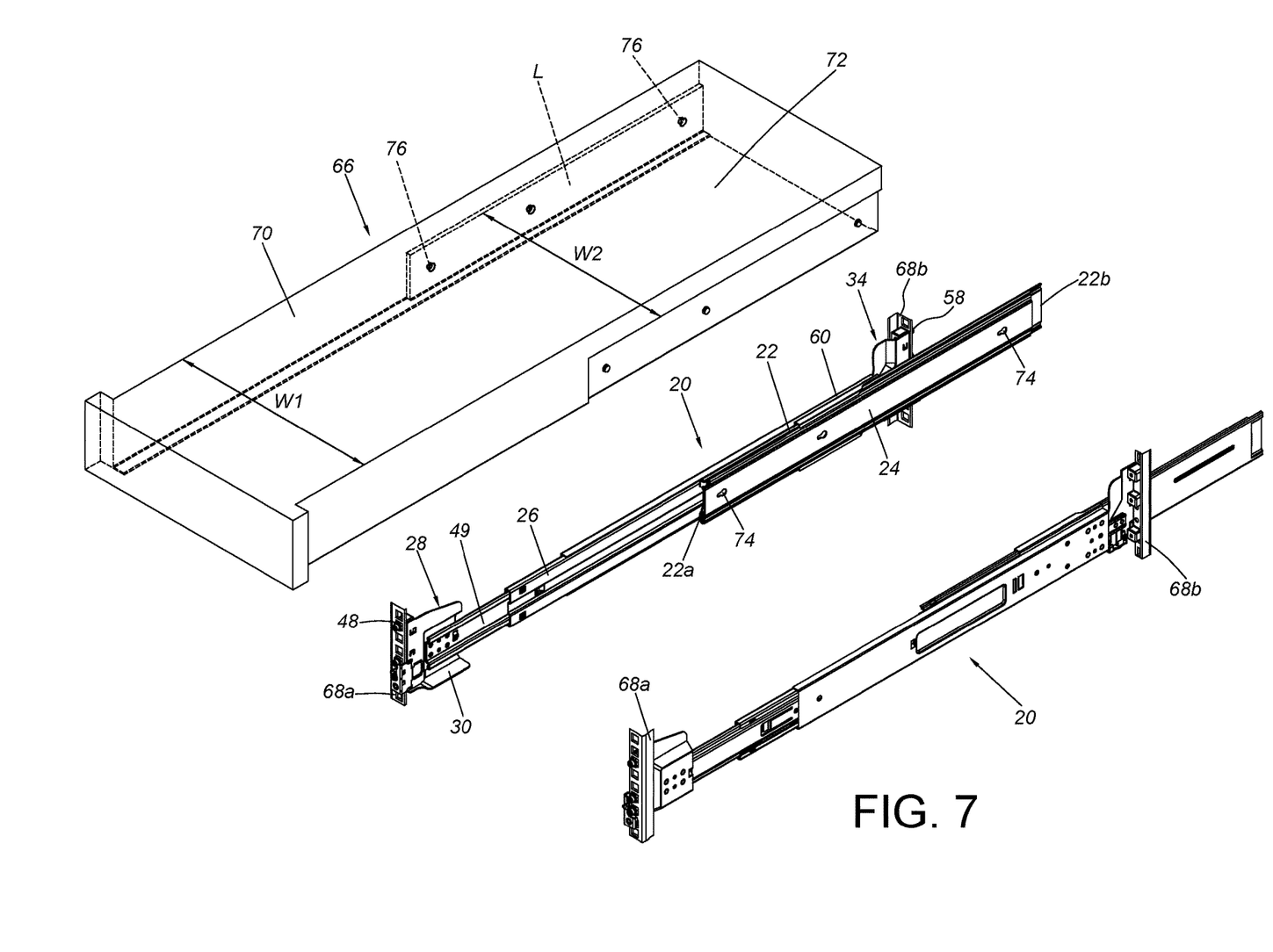
FIG. 7 is an exploded view showing the carried object being configured to be mounted to the rack through the slide rail assemblies according to an embodiment of the present invention.
Figure 8:
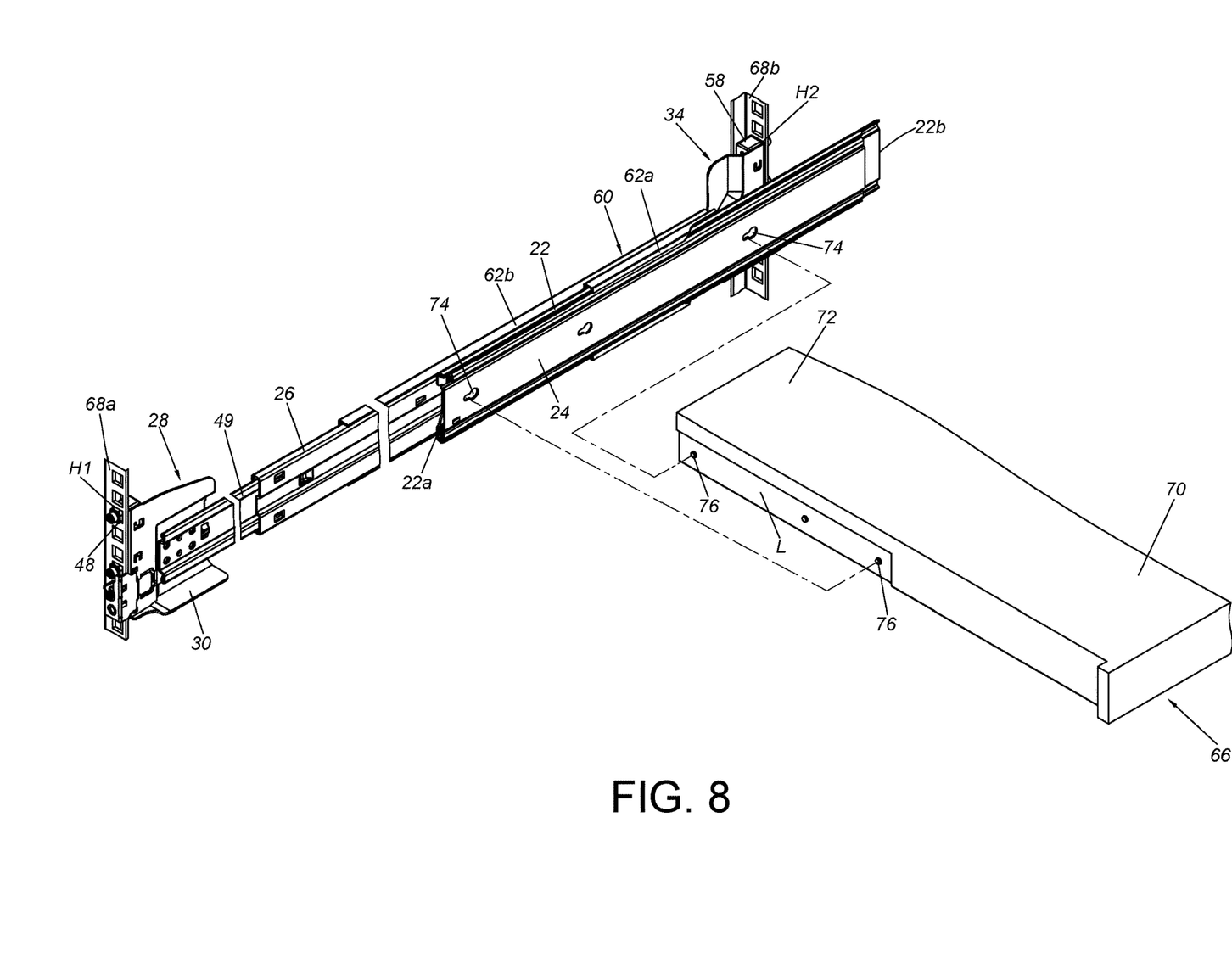
FIG. 8 is an exploded view showing the carried object being configured to be mounted to two posts of the rack through the slide rail assembly according to an embodiment of the present invention.

As shown in FIG. 6, FIG. 7 and FIG. 8, two sides of a carried object 66 is configured to be mounted to a rack through a pair of slide rail assemblies 20. Each of the slide rail assemblies 20 has a substantial identical structural arrangement. The rack comprises a pair of first posts 68a and a pair of second posts 68b. In the present embodiment, the pair of first posts 68a and the pair of second posts 68b are located at positions corresponding to and spaced from each other.

Specifically, the carried object 66 can be a chassis of an electronic device, but the present invention is not limited thereto. The carried object 66 comprises a front part 70 and a rear part 72. The front part 70 has a first width W1, and the rear part 72 has a second width W2 smaller than (or narrower than) the first width W1 (as shown in FIG. 7). Moreover, the first rail 22 of each slide rail assembly 20 can be mounted to the first post 68a and the second post 68b of the rack through the first bracket 28 and the second bracket 34. For example, the at least one first mounting member 48 of the first bracket 28 is configured to be mounted to at least one first hole H1 of the first post 68a, and the at least one second mounting member 58 of the second bracket 34 is configured to be mounted to at least one second hole H2 of the second post 68b.

The second rail 24 is configured to be mounted to the rear part 72 of the carried object 66. For example, the second rail has a plurality of mounting feature 74 configured to be correspondingly mounted to a plurality of connecting features 76 on a lateral side L of the rear part 72 of the carried object 66.

Furthermore, when the second rail 24 is located at the retracted position R relative to the first rail 22 (as shown in FIG. 6) to allow the carried object 66 to be located at the retraction position R accordingly, the first end 24a of the second rail 24 is not extended beyond the supporting feature 30, and the second rail 24 is configured to support the rear part 72 of the carried object 66. On the other hand, the supporting feature 30 is configured to directly support a bottom of the front part 70 of the carried object 66.

Figure 9:
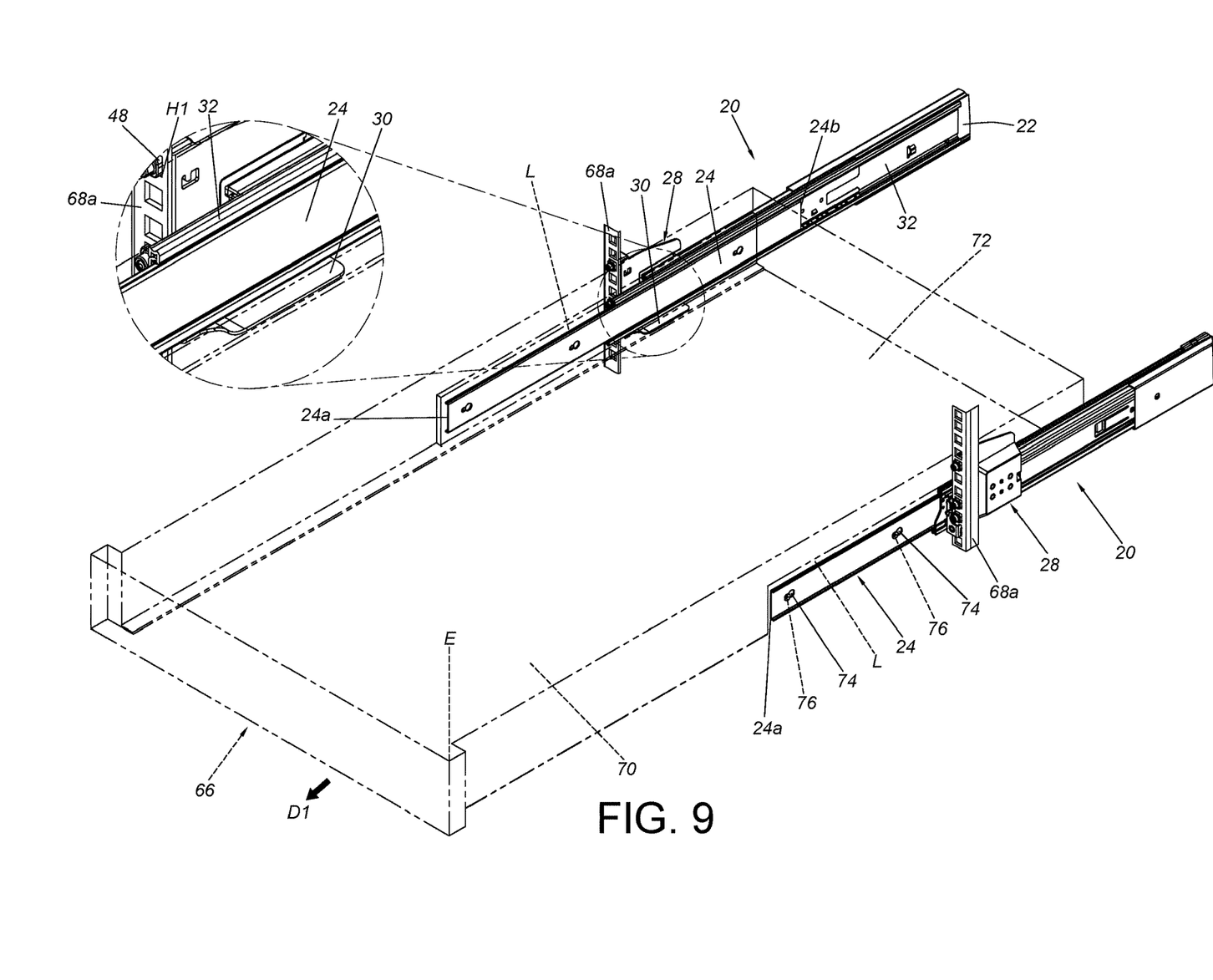
FIG. 9 is a diagram showing the carried object being located at an extension position relative to the first rail through the second rail according to an embodiment of the present invention.

As shown in FIG. 6 and FIG. 9, when the second rail 24 is moved relative to the first rail 22 from the retracted position R (as shown in FIG. 6) along the first direction D1 to an extension position E (as shown in FIG. 9) to allow the carried object 66 to be located at the extension position E accordingly, the first end 24a of the second rail 24 is extended beyond the supporting feature 30, and the supporting feature 30 is configured to support a bottom of one of the front part 70 and the rear part 72 of the carried object 66. In the present embodiment, the supporting feature 30 is configured to support the bottom of the rear part 72 of the carried object 66. In other words, the supporting feature 30 is transversely extended beyond the lateral side L of the narrower rear part 72 of the carried object 66. In one embodiment of the present invention, a total width of the rear part 72 of the carried object 66 and the pair of slide rail assemblies 20 is substantially equal to the width of the front part 70 of the carried object 66 in order to meet specific design requirements, but the present invention is not limited thereto.

Therefore, when the second rail 24 is located at the retracted position R or the extension position E relative to the first rail 22, the supporting feature 30 is configured to support the bottom (of the front part 70 or the rear part 72) of the carried object 66. Moreover, in other embodiments, the second rail 24 can be moved relative to the first rail 22 along the first direction D1 to another extension position further than the extension position E shown in FIG. 9, in order to allow the carried object 66 (the front part 70 or the rear part 72 of the carried object 66) to move beyond the supporting feature 30 along the first direction D1. In such state, the supporting feature 30 does not support the bottom of the carried object 66.

Therefore, the slide rail assembly 20 according to the embodiments of the present invention is characterized in that:

1. When the second rail 24 is located at the predetermined position (such as the retracted position R) relative to the first rail 22, the first end 24a of the second rail 24 is not extended beyond the supporting feature 30, and the supporting feature 30 is configured to support the bottom of the front part 70 of the carried object 66.

2. When the second rail 24 is located at the retracted position R or the extension position E relative to the first rail 22, the supporting feature 30 is configured to support the bottom (of the front part 70 or the rear part 72) of the carried object 66, such that the carried object 66 can have better security and safety no matter being located inside or outside the rack through the second rail 24.

3. The second bracket 34 and/or the first bracket 28 are longitudinally movable relative to the first rail 22.

4. The extension member 26 is configured to extend the length of the first rail 22 and increase partial thickness of the first rail 22, so as to improve structural strength of the first rail 22.

5. The at least one first supporting section 62a and the at least one second supporting section 62b of the supporting member 60 are located on different longitudinal planes, and the longitudinal length of the at least one second supporting section 62b is greater than the longitudinal length of the at least one first supporting section 62a. According to such arrangement, the contour of the supporting member 60 matches the first rail 22 and the extension member 26.

6. The supporting member 60 can partially cover the first rail 22 through the two first supporting sections 62a and the middle section 64, so as to improve structural strength of the first rail 22. The supporting member 60 can partially cover the extension member 26 through the two second supporting sections 62b and the middle section 64, so as to improve structural strength of the extension member 26.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail assembly, comprising:
a first rail having a first end, the first rail having a first side and a second side opposite to the first side, the first rail comprising a first wall, a second wall and a longitudinal wall connected between the first wall and the second wall of the first rail, and the first wall and the second wall of the first rail being located at the first side;
a second rail longitudinally movable relative to the first rail at the first side of the first rail, the second rail having a first end;
an extension member fixedly connected to the second side of the first rail, and the extension member being extended beyond the first end of the first rail;
a first bracket movably mounted to an extension passage of the extension member to be longitudinally movable relative to the first rail, the first bracket comprising a side wall and at least one first mounting member located adjacent to the side wall;

a second bracket longitudinally movable relative to the first rail; and a supporting feature arranged on the first bracket;

wherein when the second rail is located at a retracted position relative to the first rail, the first end of the second rail is not extended beyond the supporting feature;

wherein the second bracket comprises a side part and at least one second mounting member located adjacent to the side part, the side part is arranged with a supporting member, the supporting member has at least one first supporting section and at least one second supporting section connected to the at least one first supporting section, the at least one first supporting section is configured to support one of the first wall and the second wall of the first rail, and the at least one second supporting section is configured to support one of a first predetermined part and a second predetermined part of the extension member.

2. The slide rail assembly of claim 1, further comprising a third rail, wherein a passage is defined by the first wall, the second wall and the longitudinal wall of the first rail, and the passage is configured to accommodate the third rail, such that the third rail is located at the first side of the first rail.

3. The slide rail assembly of claim 2, wherein the third rail is movably mounted between the first rail and the second rail, and the second rail is longitudinally movable relative to the first rail at the first side of the first rail through the third rail.

4. The slide rail assembly of claim 1, wherein the supporting feature is transversely extended relative to the side wall of the first bracket.

5. The slide rail assembly of claim 1, wherein the first bracket is mounted to the extension passage of the extension member through a frame.

6. The slide rail assembly of claim 1, wherein the at least one first supporting section and the at least one second supporting section of the supporting member are located on different longitudinal planes, and a longitudinal length of the at least one second supporting section is greater than a longitudinal length of the at least one first supporting section.

7. The slide rail assembly of claim 6, wherein the supporting member has two first supporting sections, two second supporting sections and a middle section connected between the two second supporting sections, the supporting member is configured to partially cover the first rail through the two first supporting sections and the middle section, and the supporting member is configured to partially cover the extension member through the two second supporting sections and the middle section.

8. A slide rail assembly, comprising:

a first rail having a first side and a second side opposite to the first side;

a second rail;

a third rail, wherein the second rail is longitudinally movable relative to the first rail at the first side of the first rail through the third rail;

a first bracket and a second bracket located at the second side of the first rail, at least one of the first bracket and the second bracket being longitudinally movable relative to the first rail;

a supporting feature arranged on the first bracket; and an extension member fixedly connected to the second side of the first rail, wherein the extension member is extended beyond a first end of the first rail; the first rail comprises a first wall, a second wall and a longitudinal wall connected between the first wall and the second wall of the first rail;

wherein the first bracket is mounted to an extension passage of the extension member;

wherein when the second rail is located at a predetermined position relative to the first rail, an end of the second rail is not extended beyond the supporting feature;

wherein the second bracket comprises a side part and at least one second mounting member located adjacent to the side part, the side part is arranged with a supporting member, the supporting member has two first supporting sections, two second supporting sections and a middle section, the supporting member is configured to partially cover the first rail through the two first supporting sections and the middle section, and the supporting member is configured to partially cover the extension member through the two second supporting sections and the middle section.

9. The slide rail assembly of claim 8, wherein the first bracket comprises a side wall and at least one first mounting member located adjacent to the side wall.

10. The slide rail assembly of claim 8, wherein a passage is defined by the first wall, the second wall and the longitudinal wall of the first rail, and the passage is configured to accommodate the third rail, such that the third rail is located at the first side of the first rail.

11. The slide rail assembly of claim 10, wherein the third rail is movably mounted between the first rail and the second rail.

12. The slide rail assembly of claim 9, wherein the supporting feature is transversely extended relative to the side wall of the first bracket.

13. The slide rail assembly of claim 8, wherein the first bracket is movably mounted to the extension passage of the extension member through a frame.

14. A slide rail assembly configured to mount a carried object to a rack, the carried object comprising a front part and a rear part, the front part having a first width, and the rear part having a second width smaller than the first width, the slide rail assembly, comprising:

a first rail;

a first bracket and a second bracket longitudinally movable relative to the first rail, the first bracket and the second bracket being configured to mount the first rail to a first post and a second post of the rack;

a second rail longitudinally movable relative to the first rail, the second rail being mounted to the rear part of the carried object;

a supporting feature arranged on the first bracket; and an extension member fixedly connected to the first rail, wherein the extension member is extended beyond a first end of the first rail, the first bracket is movably mounted to an extension passage of the extension member, the first bracket comprises at least one first mounting member configured to be mounted to at least one first hole of the first post, the second bracket comprises a side part and at least one second mounting member located adjacent to the side part, the side part is arranged with a supporting member, the supporting member has at least one first supporting section and at least one second supporting section, the at least one first supporting section is configured to support the first rail, the at least one second supporting section is configured to support the extension member, and the at least one second mounting member is configured to be mounted to at least one second hole of the second post;

wherein when the second rail is located at a retracted position relative to the first rail, the supporting feature is configured to support the front part of the carried object.

15. The slide rail assembly of claim 14, wherein when the second rail is moved relative to the first rail from the retracted position to an extension position along one direction, the supporting feature is configured to support one of the front part and the rear part of the carried object.

* * * * *